(12) United States Patent
Spinali (10) Patent No.: US 6,496,246 B1
(45) Date of Patent: Dec. 17, 2002

(54) OPTICAL ASSEMBLY FOR AN EXPOSURE APPARATUS

(75) Inventor: Marc Spinali, San Ramon, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/526,046

(22) Filed: Mar. 15, 2000

(51) Int. Cl.$^7$ .......................... G03B 27/54; G03B 27/52
(52) U.S. Cl. .......................... 355/67; 355/30; 359/507; 359/509
(58) Field of Search .............................. 355/67, 30, 53; 359/665, 667, 507, 509, 512, 513

(56) References Cited

U.S. PATENT DOCUMENTS

| | | | | |
|---|---|---|---|---|
| 3,399,942 A | * | 9/1968 | Berreman | 359/667 |
| 3,528,727 A | | 9/1970 | Halliday | 359/655 |
| 4,616,908 A | * | 10/1986 | King | 359/505 |
| 5,229,081 A | * | 7/1993 | Suda | 422/186 |
| 6,252,648 B1 | * | 6/2001 | Hase et al. | 355/53 |
| 6,288,769 B1 | * | 9/2001 | Akagawa et al. | 355/30 |

FOREIGN PATENT DOCUMENTS

JP        2856626        11/1998

* cited by examiner

Primary Examiner—Rodney Fuller
(74) Attorney, Agent, or Firm—Steven G. Roeder; Jim Rose, Esq.

(57) ABSTRACT

A optical assembly (10) for directing and/or focusing a beam of light energy (11) for an exposure apparatus (28) is provided herein. The optical assembly (10) includes one or more optical sections (12) which are assembled together. At least one of the optical sections (12) includes an optical housing (14) having an inner wall (15) which defines a optical chamber (16). One or more optical elements (18) can be secured to the optical housing (14) of each optical section (12). Additionally, each optical section (12) can include a plurality of outlet ports (20) and a plurality of inlet ports (22) for purging the optical chamber (16). The inlet ports (22) and the outlet ports (20) are uniquely positioned to minimize the time required to purge the optical assembly (10) and the amount of replacement fluid (24) used to purge the optical assembly (10).

38 Claims, 10 Drawing Sheets

OPTICAL ASSEMBLY FOR AN EXPOSURE APPARATUS

FIELD OF THE INVENTION

The present invention is directed to an optical assembly for an exposure apparatus. More specifically, the present invention is directed to an optical assembly having ports strategically positioned for purging the optical assembly and a method for efficiently purging an optical assembly.

BACKGROUND

Exposure apparatuses are commonly used to transfer an image from a reticle onto a semiconductor wafer. A typical exposure apparatus includes an apparatus frame, an illumination source, a reticle stage, a wafer stage, and an optical assembly which cooperate to transfer an image of an integrated circuit from the reticle onto the wafer. The illumination source generates a beam of light energy which passes through the reticle. The optical assembly directs and/or focuses the light passing through the reticle to the wafer.

The size of the integrated circuits transferred onto the wafer are extremely small. Accordingly, the precise directing and/or focusing of the light by the optical assembly is critical to the manufacture of high density semiconductor wafers.

Unfortunately, depending upon the type of light generated by the illumination source, the type of fluid in the optical assembly can influence the performance of the exposure apparatus. For example, some types of light are absorbed by oxygen. As is well known, air is a gaseous mixture which is approximately twenty-one percent oxygen. Thus, air in the optical assembly can influence the performance of the optical assembly and the exposure apparatus. As a result thereof, the quality of the integrated circuits formed on the wafer can be compromised.

In light of the above, it is an object of the present invention to provide an exposure apparatus which is capable of generating high resolution patterns on a semiconductor wafer. Another object of the present invention to provide an optical assembly which can be purged of any unwanted fluid relatively easily and efficiently. Still, another object of the present invention is to provide an optical assembly which minimizes the amount of time required to dilute the unwanted fluid and the amount of replacement fluid used to dilute the unwanted fluid in the optical assembly to acceptable levels.

SUMMARY

The present invention is directed to an optical assembly for directing and/or focusing a beam of light energy. The optical assembly includes an optical housing having an inner wall which defines an optical chamber. One or more optical elements are secured to the optical housing. Additionally, the optical assembly includes an outlet port and an inlet port for purging the optical chamber. Uniquely, the inlet port directs a replacement fluid from a fluid source into the optical chamber substantially tangential to the inner wall of the optical housing so that the replacement fluid swirls in a first rotational direction in the optical chamber. This minimizes the time needed to purge the optical assembly of any unwanted fluid and the amount of replacement fluid used to dilute the unwanted fluid in the optical chamber to acceptable levels.

Preferably, the optical housing includes a plurality of inlet ports and a plurality of outlet ports placed at various strategic locations around the circumference of the optical housing. The inlet ports are strategically positioned to maximize flow velocities and fluid mixing within the optical chamber. For example, upper inlet ports can be positioned near an upper region of the optical housing and lower inlet ports can be positioned near a lower region of the optical housing. These inlet ports circulate the fluid in a circular pattern in the optical chamber and direct the fluid towards an intermediate region of the optical housing.

The outlet ports are also designed to assist in creating and controlling the flow patterns of the fluid in the optical chamber. For example, outlet ports are positioned in the intermediate region of the optical housing to receive the fluid forced to the intermediate region. Additional outlet ports are positioned near each optical element to exhaust the fluid in the tight spaces near each optical element. These outlet ports reduce the amount of trapped gasses and reduce the amount of dilution time required to replace the unwanted fluid with the replacement fluid.

Additional inlet ports can be used to reverse the direction of the swirl within the optical chamber. With this design, the inlet ports may be pulsed on and off in both directions to create turbulence within the optical chamber. The turbulence improves mixing of the fluids in the optical chamber and reduces the amount of time required to dilute the unwanted fluid in the optical chamber.

The present invention is also a method for purging an optical housing of an optical assembly. The method includes the step of directing a fluid into the optical chamber substantially tangential to the inner wall so that the fluid swirls in a first rotation direction in the optical chamber.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
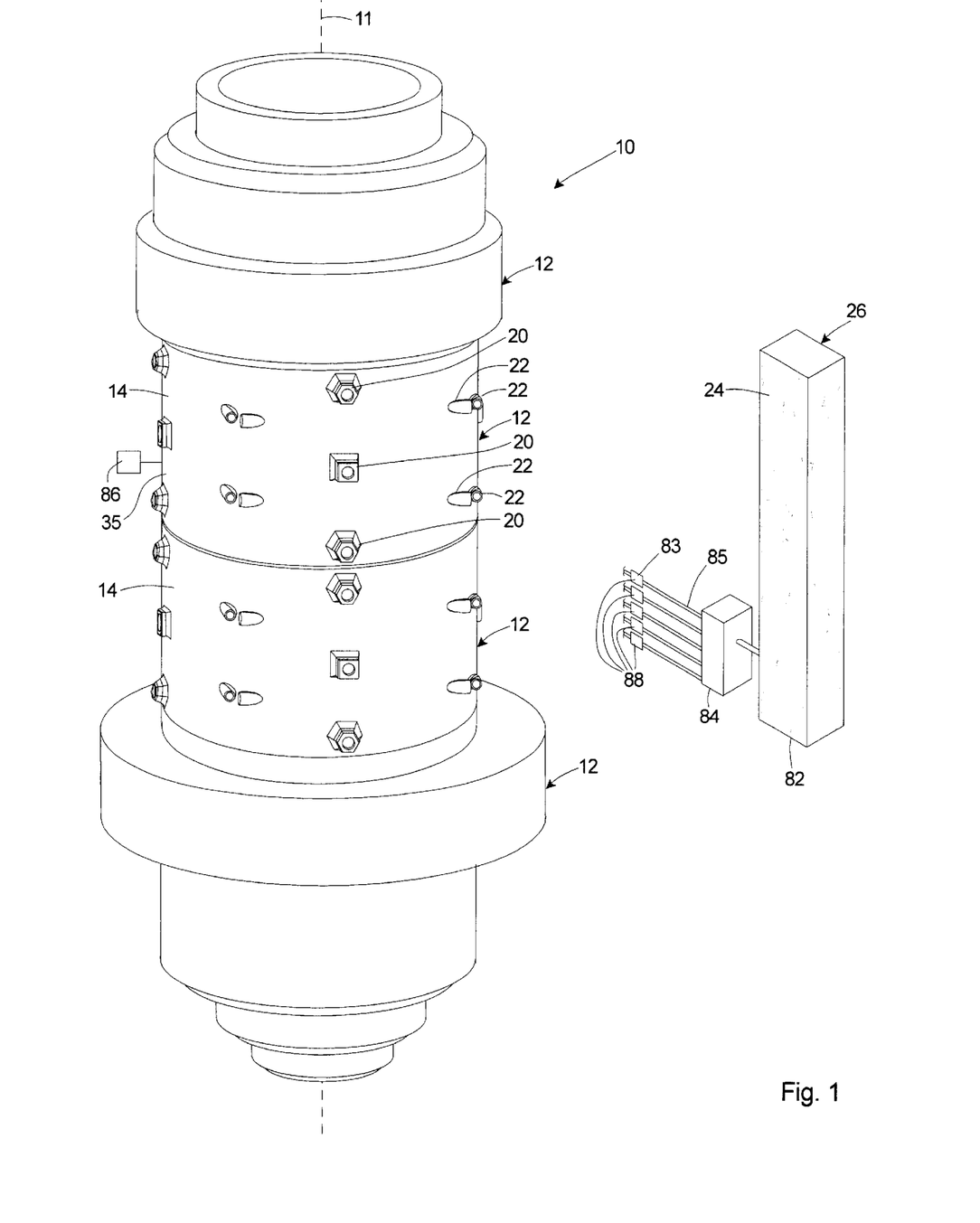
FIG. 1 is a perspective view of an optical assembly and a fluid source having features of the present invention.
Figure 2:
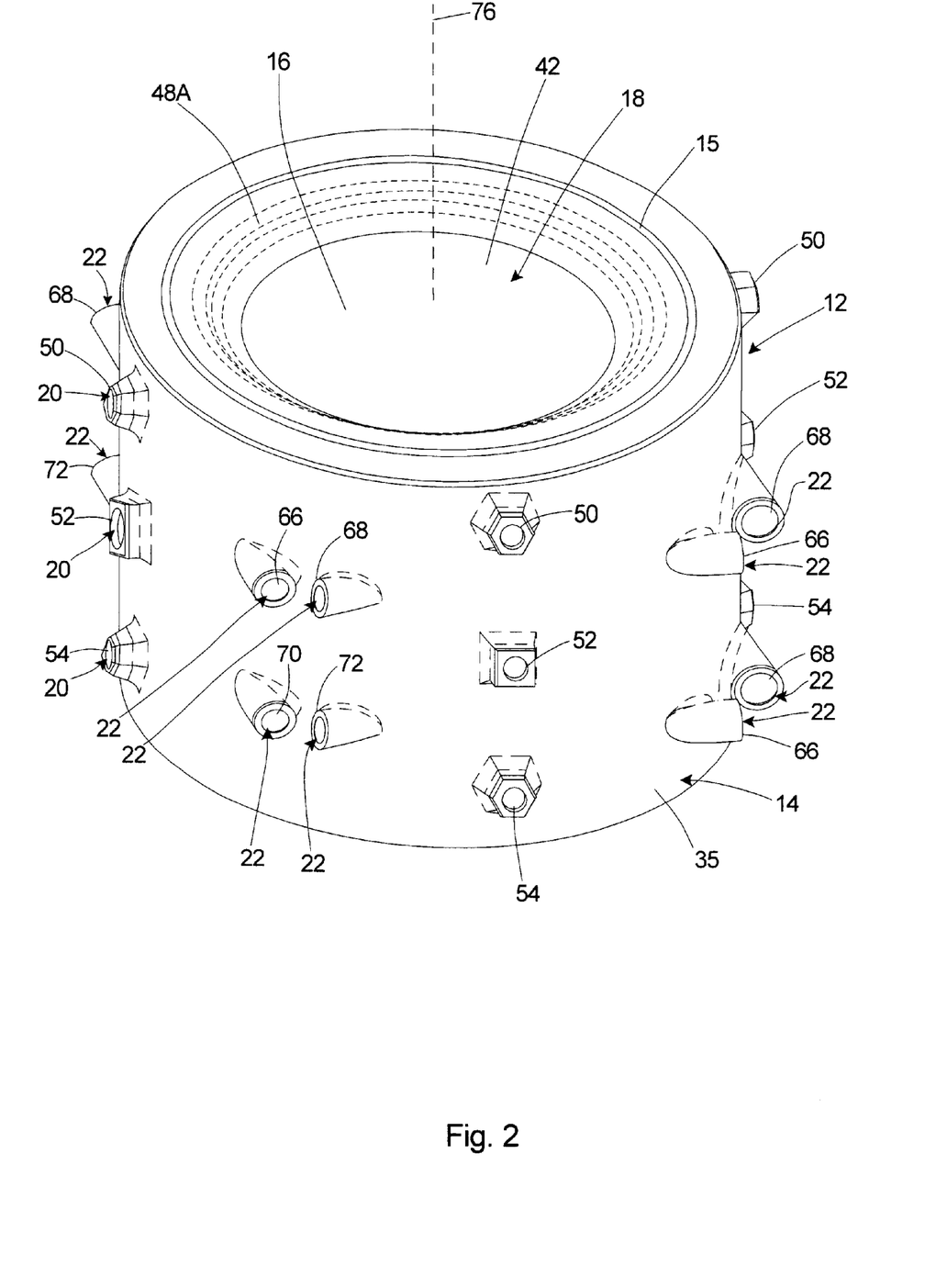
FIG. 2 is a perspective view of an optical section of the optical assembly of FIG. 1.

Referring initially to FIG. 1, the present invention is directed to optical assembly 10 for directing and/or focusing a beam of light energy 11 (shown in phantom). The optical assembly 10 includes one or more optical sections 12 which are assembled together to form the optical assembly 10. As illustrated in FIGS. 2–11, at least one of the optical sections 12 can include an optical housing 14 having an inner wall 15 which defines a portion of an optical chamber 16. Further, one or more optical elements 18 can be secured to the optical housing 14 of each optical section 12.

Preferably, each optical section 12 includes a plurality of outlet ports 20 and a plurality of inlet ports 22 for purging the optical chamber 16. The inlet ports 22 direct a replacement fluid 24 from a fluid source 26 into the optical chamber 16. The inlet ports 22 are strategically positioned to maximize the flow velocity and mixing of the replacement fluid 24 within the optical chamber 16. The outlet ports 20 are positioned to efficiently exhaust unwanted fluid 27 (illustrated as arrows in FIGS. 8–10) from the optical chamber 16. With this design, each optical section 12 can be purged of unwanted fluid 27 relatively easily and efficiently. Further, the time required to purge the optical assembly is minimized and the amount of replacement fluid 24 used to dilute the unwanted fluid 27 in the optical chamber 16 to acceptable levels is minimized.

As discussed below and illustrated in FIG. 12, the optical assembly 10 provided herein is particularly useful with an exposure apparatus 28 having an illumination system 30 for the transferring of an image from a reticle 32 to a device, e.g. a semiconductor wafer 34.

The optical assembly 10 projects and/or focuses the light 11 passing through the optical assembly 10. The design of the optical assembly 10 can be varied according to the design requirements of the exposure apparatus 28. For example, the optical assembly 10 can magnify or reduce the image illuminated on the reticle 32. In terms of the magnification of the optical assembly 10 included in the photolithography system, the optical assembly 10 need not be limited to a reduction system. It could also be a 1× or magnification system.

Further, if the illumination system 30 generates ultra-violet rays such as the excimer laser, glass materials such as quartz and flourite that transmit ultra-violet rays are preferably used in the optical assembly 10. The illumination system 30 can be KrF excimer laser (248 nm), ArF excimer laser (193 nm), F2 laser (157 nm) and X-ray. If the illumination system 30 is an F2 laser or an x-ray, the optical assembly 10 should be either catadioptric or refractive. If the illumination system 30 includes an electron beam, the optical assembly 10 should consist of electron opticales and deflectors.

The optical assembly 10 illustrated in the FIG. 1 is generally cylindrical shaped. The optical assembly 10 includes one or more optical sections 12 that are attached together and form the optical assembly 10. The design of each optical section 12 can vary according to the design of the optical assembly 10. FIGS. 2–11 illustrate one embodiment of an optical section 12 having features of the present invention. However, as illustrated in FIG. 1, the optical assembly 10 can include one or more optical sections 12 which do not have inlet ports or outlet ports as described herein.

Figure 3:
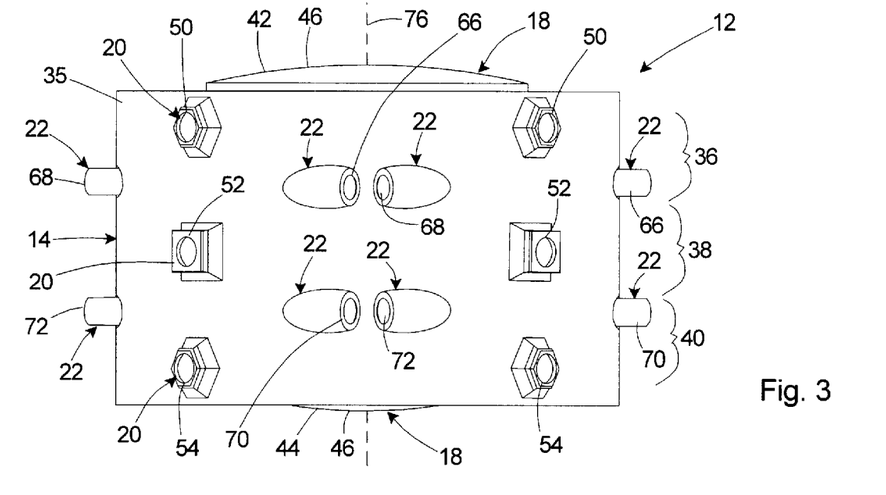
FIG. 3 is a side plan view of the optical section of FIG. 2.
Figure 4:
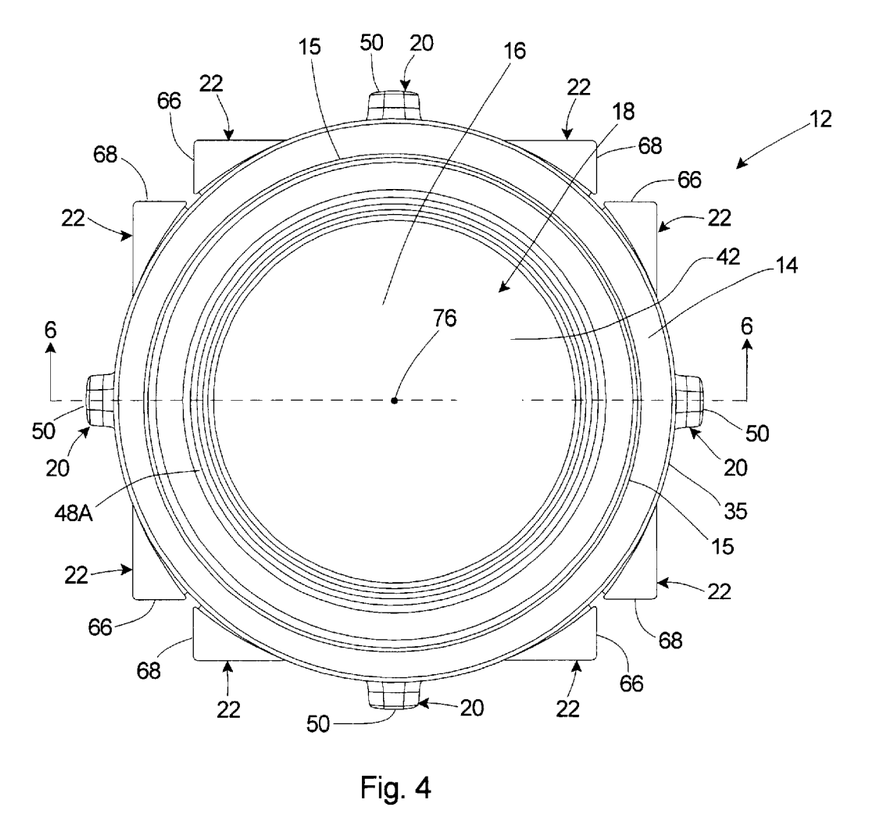
FIG. 4 is a top plan view of the optical section of FIG. 2.
Figure 5:
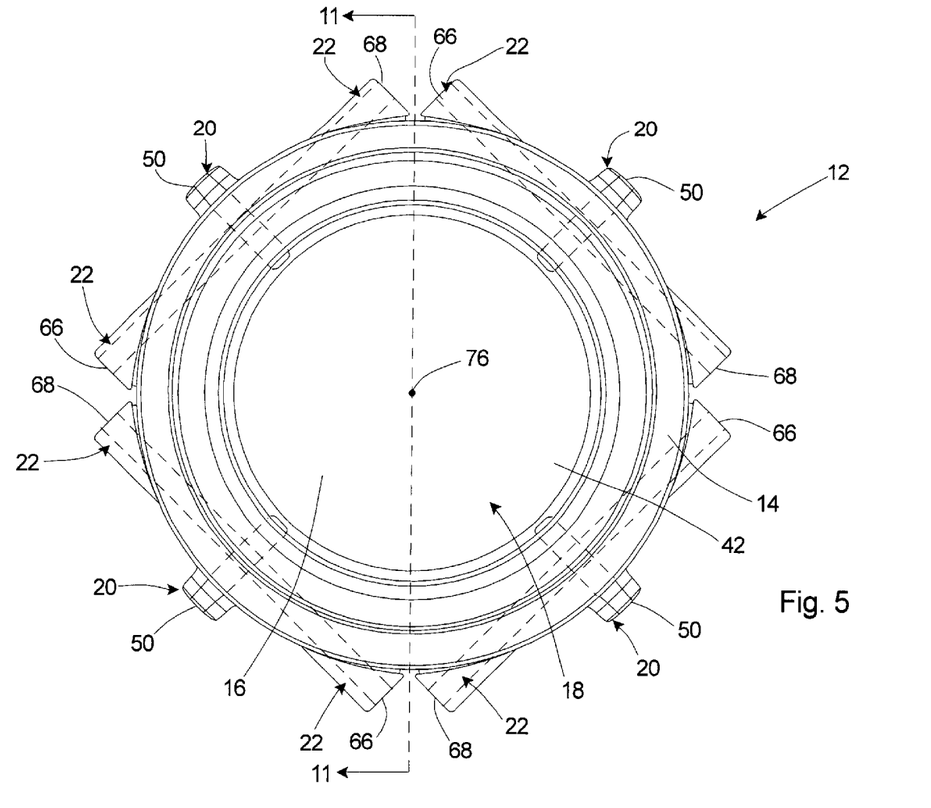
FIG. 5 is a top plan view of the optical section of FIG. 2, including some of the ports illustrated in phantom.

In the embodiment illustrated in FIGS. 2–11, the optical housing 14 is substantially tubular or annular shaped and the optical chamber 16 is substantially right, cylindrical shaped and has a circular shaped cross-section. The optical housing 14 includes the inner wall 15 and an outer wall 35. For ease of discussion, the optical housing 14 is subdivided into three, annular shaped regions, according to their physical location. Namely, as illustrated in FIG. 3, the optical housing 14 is subdivided into an upper region 36, an intermediate region 38, and a lower region 40.

In the optical section 12 illustrated in FIGS. 2–11, an upper optical element 42 is secured to the upper region 36 and a lower optical element 44 is secured to the lower region 40. Stated another way, the optical elements 18 are spaced apart and are positioned in opposite regions 36, 40 of the optical housing 14. Each optical element 18 is typically made of a ground or molded piece of substantially transparent material such as glass or plastic. Each optical element 18 includes opposed surfaces 46, either or both of which are curved so that the light rays converge or diverge. Importantly, the number of optical elements 18 for each optical section 12 and the design of each optical element 18 can be varied to suit the requirements of the optical assembly 10. Further, each optical element 18 can be a lens, a refractive mirror, or a prism.

Figure 6:
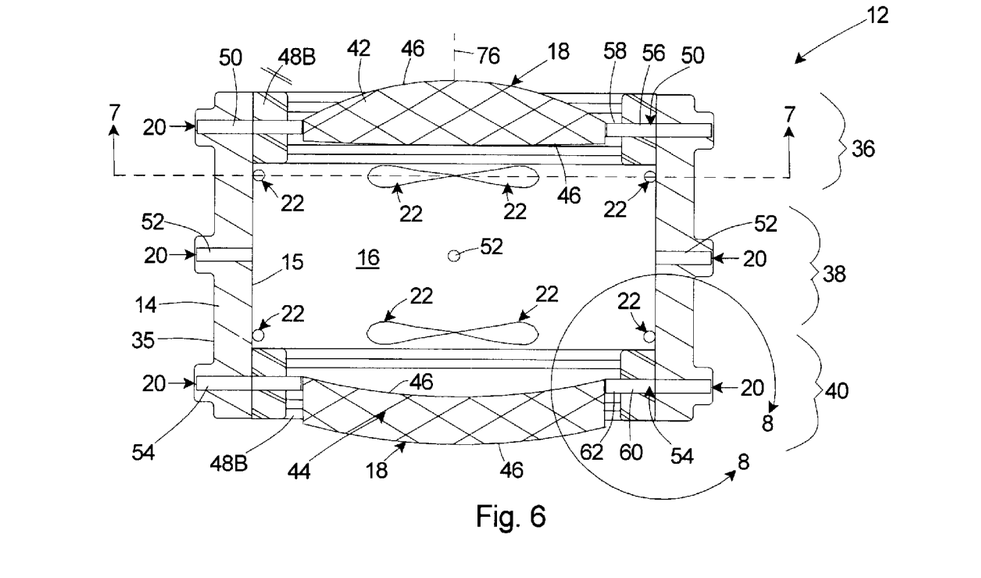
FIG. 6 is a cross-sectional view of the optical section taken on line 6—6 of FIG. 4.
Figure 7:
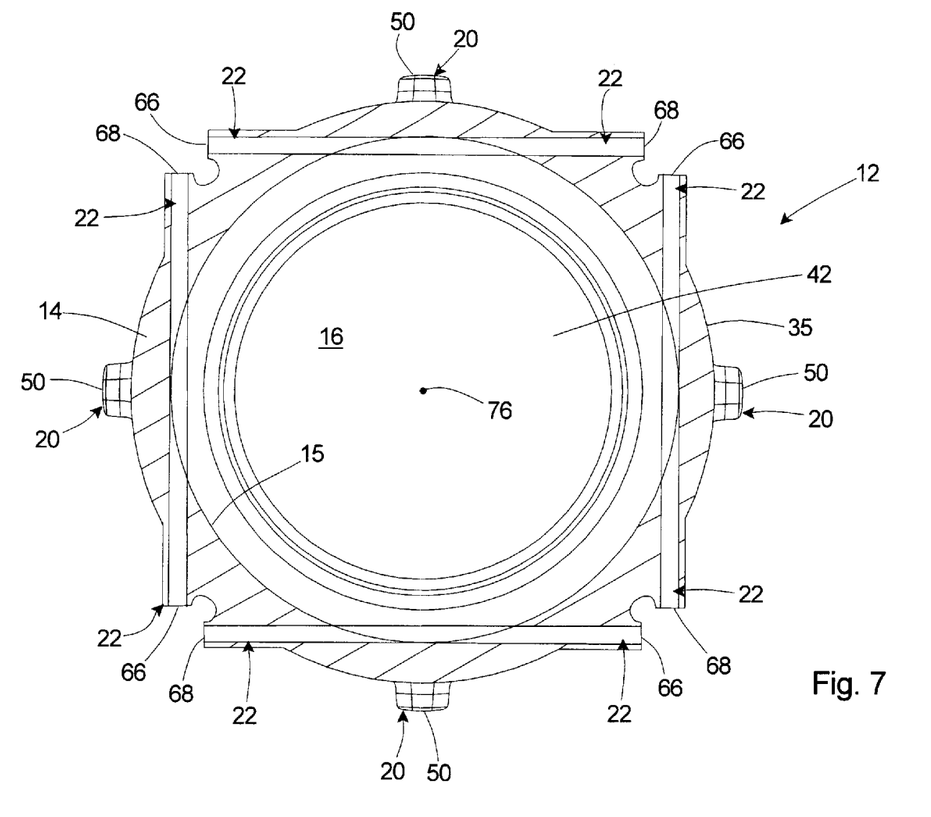
FIG. 7 is a cross-sectional view of the optical section taken on line 7—7 of FIG. 6.
Figure 8:
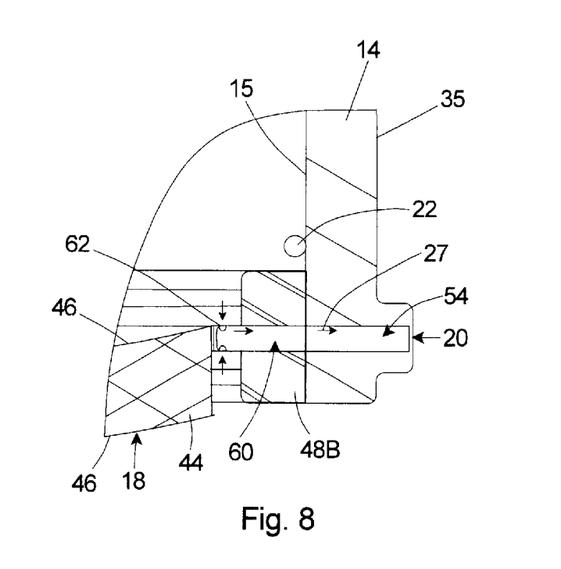
FIG. 8 is an enlarged view taken on line 8—8 of FIG. 6.
Figure 11:
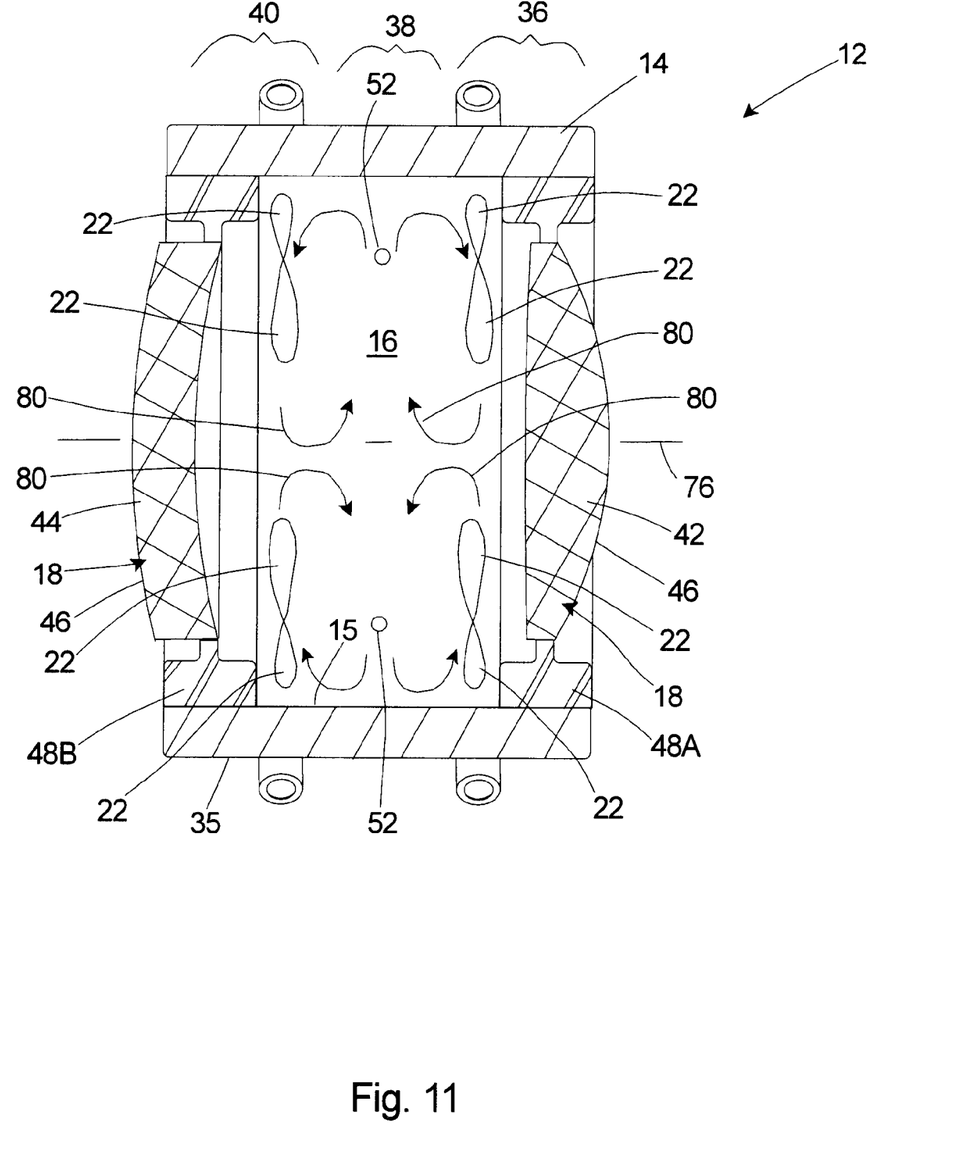
FIG. 11 is a cross-sectional view taken on line 11—11 in FIG. 5, including a secondary flow pattern.

As can best be seen with reference to FIGS. 6 and 11, the upper optical element 42 is secured to the optical housing 14 with an upper optical element supporter 48A, and the lower optical element 44 is secured to the optical housing 14 with a lower optical element supporter 48B. Each optical element supporter 48A, 48B is annular shaped and extends between the inner wall 15 of the optical housing 14 and one of the optical elements 42, 44 to radially support one of the optical elements 42, 44 spaced apart from the optical housing 14. In the embodiment illustrated in the Figures, each optical element supporter 48A, 48B encircles one of the optical elements 42, 44. Each optical element supporter 48A, 48B illustrated in the Figures has a cross-sectional shape, which is somewhat similar to a "T". Each optical element supporter 48A, 48B can be made of a number of materials including a metal or plastic.

As provided above, the plurality of spaced apart outlet ports 20 and the plurality of spaced apart inlet ports 22 extend through the optical housing 14 into the optical chamber 16. The inlet ports 22 and the outlet ports 20 are used to purge the unwanted fluid 27 from the optical chamber 16. More specifically, the inlet ports 22 and the outlet ports 20 are used to replace some or all of the unwanted fluid 27 in the optical chamber 16 with the replacement fluid 24 until the level of unwanted fluid 27 in the optical chamber 16 is reduced to acceptable levels. An acceptable level as provided herein may be approximately single digit, parts per million (ppm) residual unwanted fluid 27. Examples of unwanted fluid 27 include oxygen, water and carbon dioxide. Thus, an acceptable level as provided herein may be approximately single digit, parts per million (ppm) residual oxygen level, residual water level and residual carbon dioxide level. The inlet ports 22 and the outlet ports 20 are uniquely oriented to minimize the time required to purge the optical chamber 16 and minimize the amount of replacement fluid 24 used to dilute the unwanted fluid 27 in the optical chamber 16 to acceptable levels.

The number and exact location of the outlet ports 20 can be varied according to the design of the optical section 12. The optical section 12 illustrated in the Figures, includes a plurality of upper outlet ports 50, a plurality of intermediate outlet ports 52 and a plurality of lower outlet ports 54 which are axially spaced apart. The number of upper outlet ports 50, intermediate outlet ports 52 and lower outlet ports 54 can be varied. In the embodiment illustrated in the Figures, the optical section 12 includes four upper outlet ports 50, four intermediate outlet ports 52 and four lower outlet ports 54. Alternately, for example, the optical section 12 could include three upper outlet ports 50, five intermediate outlet ports 52 and three lower outlet ports 54. Further, the size of each outlet port 20 can be varied. For the embodiment illustrated herein, each outlet port 20 has an inner diameter of between approximately 3 and 10.

The upper outlet ports 50 are spaced apart circumferentially in the upper region 36, near the upper optical element 42. Each upper outlet port 50 includes a radially extending main channel 56, which extends substantially radially through the optical housing 14 and the upper optical element supporter 48A. Each main channel 56 of each upper outlet port 50 extends substantially radially from the upper optical element 42. Further, each upper outlet port 50 includes a transverse channel 58, which extends transversely through the upper optical element supporter 48A and the main channel 56 near the upper optical element 42. The upper outlet ports 50 are uniquely positioned to exhaust the unwanted fluid 27 out of the tight spaces between the upper optical element 42 and the upper optical element supporter 48A and at the interface between adjacent optical sections 12. Each transverse channel 58 facilitates the exhaust of the unwanted fluid 27 near the upper optical element 42 and the upper optical element supporter 48A. The upper outlet ports 50 reduce the amount of trapped unwanted fluid 27 and reduce the dilution time.

The intermediate outlet ports 52 are spaced apart circumferentially in the intermediate region 38 of the optical housing 14. The intermediate outlet ports 52 are designed and positioned to exhaust the majority of the unwanted fluid 27 during the purging process. Each intermediate outlet port 52 illustrated in the Figures extends substantially radially through the optical housing 14.

The lower outlet ports 54 are spaced apart circumferentially in the lower region 40, near the lower optical element 44. Each lower outlet port 54 includes a radially extending main channel 60, which extends substantially radially through the optical housing 14 and the lower optical element supporter 48B near the lower optical element 44. Each main channel 60 of each lower outlet port 54 extends substantially radially from the lower optical element 44. Further, each lower outlet port 54 includes a transverse channel 62, which extends transversely through the lower optical element supporter 48B and the main channel 60 near the lower optical element 44. The transverse channel 62 facilitates the exhaust of the unwanted fluid 27 near the lower optical element 44 and the lower optical element supporter 48B.

The unwanted fluid 27 which exhausts from the outlet ports 20 can be captured in a container (not shown) for recycling or released directly in the atmosphere.

The inlet ports 22 are uniquely oriented to primarily cause the fluid within the optical chamber 16 to swirl and mix. As can best be seen with reference to FIGS. 5, 7, 9, and 10, each inlet port 22 extends through the optical housing 14 into the optical chamber 16 substantially tangential to the inner wall 15. This causes the fluid represented by arrows 64 in FIGS. 9 and 10 to swirl within the optical chamber 16.

The number of inlet ports 22 and the location of the inlet ports 22 can be varied. The embodiment illustrated in the Figures includes a plurality of upper inlet port assemblies including a plurality of first upper inlet ports 66 and a plurality of opposed, second upper inlet ports 68. The embodiment illustrated in the Figures further includes a plurality of lower inlet port assemblies including a plurality of first lower inlet ports 70 and a plurality of opposed, second lower inlet ports 72. The optical section 12 illustrated in the Figures includes four, first upper inlet ports 66; four, second upper inlet ports 68; four, first lower inlet ports 70; and four, second lower inlet ports 72. Alternately, for example, the optical section 12 can include three, first upper inlet ports 66; five, second upper inlet ports 68; three, first lower inlet ports 70; and five, second lower inlet ports 72. Further, the size of each inlet port 22 can be varied. For the embodiment illustrated herein, each inlet port 22 has an inner diameter of between approximately 2 and 10.

The first, upper inlet ports 68 are spaced apart circumferentially in the upper region 36 and are positioned between the upper outlet ports 50 and the intermediate outlet ports 52. The second, upper inlet ports 68 are spaced apart circumferentially in the upper region 36 and are positioned between the upper outlet ports 50 and the intermediate outlet ports 52. The first lower inlet ports 70 are spaced apart circumferentially in the lower region 40 and are positioned between the lower outlet ports 54 and the intermediate outlet ports 52. Somewhat similarly, the second lower inlet ports 72 are spaced apart circumferentially in the lower region 40 and are positioned between the lower outlet ports 54 and the intermediate outlet ports 52.

As provided above, each inlet port 22 extends through the optical housing 14 into the optical chamber 16 substantially tangential to the inner wall 15. This causes the fluid represented by arrows 64 in FIGS. 9 and 10 to swirl within the optical chamber 16.

Figure 9:
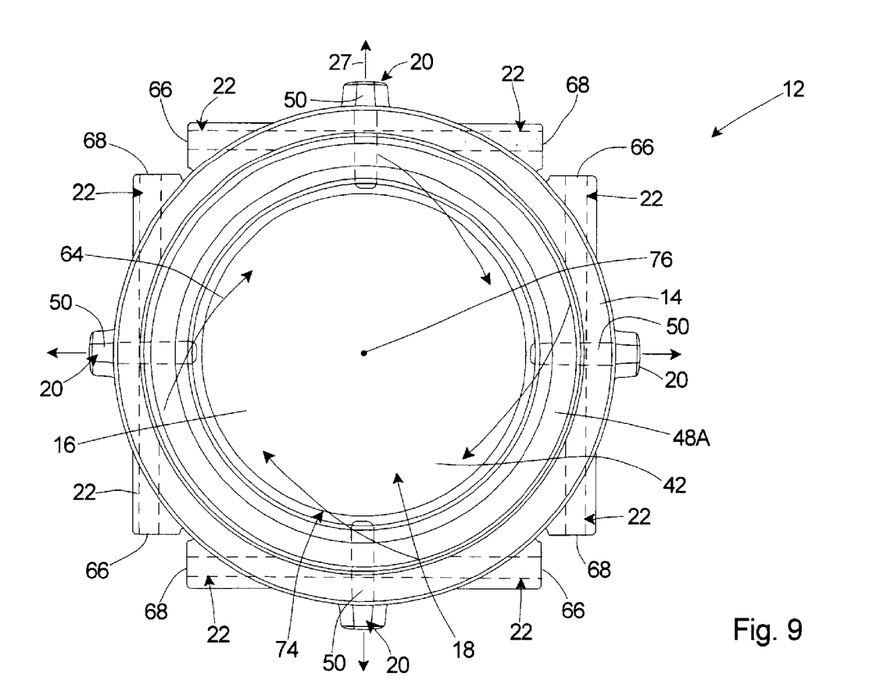
FIG. 9 is a top plan view of the optical section illustrating the primary flow pattern of the fluid in the optical section.

Uniquely, the first upper inlet ports 66 direct the replacement fluid 24 into the optical chamber 16 in the substantially opposite direction as the second upper inlet ports 68. Similarly, the first lower inlet ports 70 direct the replacement fluid 24 into the optical chamber 16 in the substantially opposite direction as the second lower inlet ports 72. The significance of this feature can probably best be understood with reference to FIGS. 9 and 10. In particular, FIG. 9 illustrates with arrows 64, that flow of the replacement fluid 24 from the first upper inlet ports 66 and the first lower inlet ports 70 (not shown in FIG. 9) causes the fluid in the optical chamber 16 to swirl in a clockwise, first rotational direction 74 relative to a central axis 76 of the optical housing 14. In FIG. 9, there is no flow from the second upper inlet ports 68 and the second lower inlet ports 72 (not shown in FIG. 9).

Figure 10:
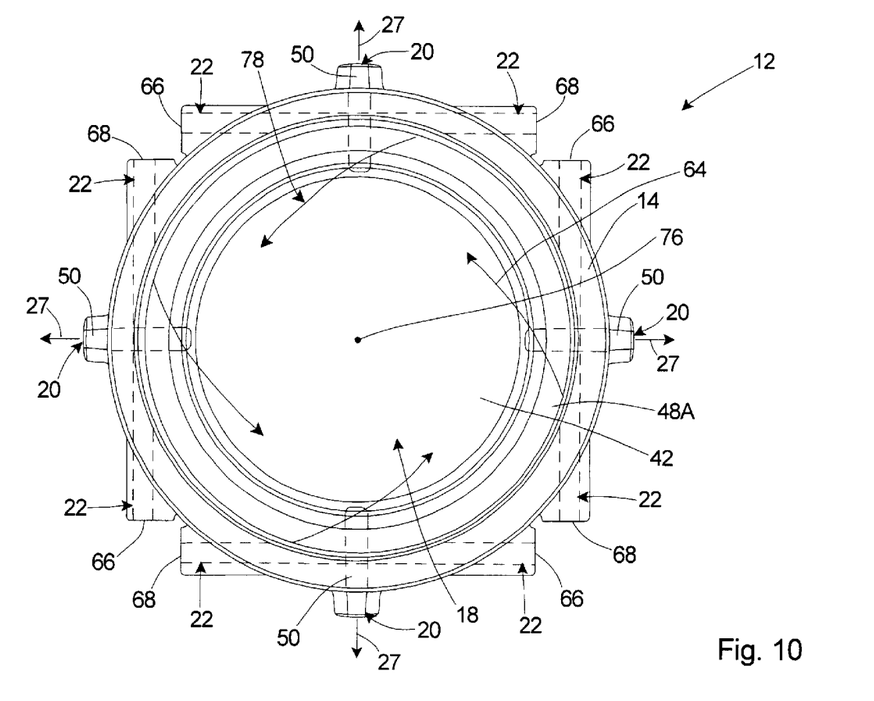
FIG. 10 is a top plan view of the optical section illustrating an alternate primary flow pattern of the fluid in the optical section.

In contrast, FIG. 10 illustrates with arrows 64, that flow of the replacement fluid 24 from the second upper inlet ports 68 and the second lower inlet ports 72 (not shown in FIG. 10) causes the fluid in the optical chamber 16 to swirl in a counter clockwise, second rotational direction 78 relative to the central axis 76 of the optical housing 14. In FIG. 10, there is no flow from the first upper inlet ports 66 and the first lower inlet ports 70 (not shown in FIG. 10).

With this design, (i) the first upper inlet ports 66 and the first lower inlet ports 70 and (ii) the second upper inlet ports 68 and the second lower inlet ports 72 may be alternately pulsed on and off to create flow in each rotational direction 74, 78 and turbulence within the optical chamber 16. To accomplish this task, replacement fluid 24 from the fluid source 26 is alternately delivered to (i) the first upper inlet ports 66 and the first lower inlet ports 70 and (ii) the second upper inlet ports 68 and the second lower inlet ports 72 to change the direction of flow in the optical chamber 16. The turbulence improves mixing of the fluids in the optical chamber 16 and reduces the amount of time required to dilute the unwanted fluid 27 in the optical chamber 16.

Importantly, the optical section 12 includes the plurality of inlet ports 22 and the plurality of outlet ports 20 placed at various strategic locations around the circumference of the optical section 12. The inlet ports 22 are positioned to maximize flow velocities and fluid mixing within the optical chamber 16. The inlet ports 22 in the upper region 36 of the optical housing 14 and the inlet ports 22 in the lower region 40 create a primary flow of fluid in a circular, swirling pattern in the optical chamber 16. Referring to FIG. 11, as additional replacement fluid 24 enters the upper region 36 and the lower region 40, the fluid flows in a direction away from the inlet ports 22 and toward the intermediate region 38, due to lower pressure in the intermediate region 38. Stated another way, the inlet ports 22 create a secondary flow of fluid, represented by arrows 80 towards the intermediate region 38 of the optical housing 14.

The outlet ports 22 are also designed and positioned to assist in creating and controlling the flow patterns of the fluid in the optical chamber 16. For example, the intermediate outlet ports 52 are positioned between the inlet ports 22 in the upper region 36 of the optical housing 14 and the inlet ports 22 in the lower region 40 to receive the fluid which is being forced away from the inlet ports 22 in the upper region 36 and the inlet ports 22 in the lower region 40. Thus, the intermediate outlet ports 52 support and facilitate the secondary flow of fluid, represent by arrows 80.

Additional outlet ports 50, 54 are positioned near each optical element 42, 44 to exhaust the fluid in the tight spaces near each optical element 42, 44. These outlet ports 50, 54 reduce the amount of trapped gasses and reduce the amount of dilution time required to replace the unwanted fluid 27 with the replacement fluid 24.

The fluid source 26 provides a source of pressurized replacement fluid 24 for purging the optical chamber 16. The design of the fluid source 26 can be varied. For example, the fluid source 26 can be a pressurized container 82 retaining the replacement fluid 24. The fluid source 26 can include a manifold 84 that is in fluid communication with one or more of the inlet ports 22 and directs the fluid 24 to the desired inlet port 22. The fluid source 26 can be equipped with a plurality of valves 83, a plurality of hoses 85, and a controller 88. The hoses 85 connect the manifold 84 to the inlet ports 22. Each valve 83 is positioned in line with one of the hoses 85. With this design, the controller 88 controls the opening and closing of each valve 83 to create the desired flow of fluid 24 in each rotational direction 74, 78 in the optical chamber 16.

The type of replacement fluid 24 utilized herein can vary according to the type of illumination system 30 utilized. For example, the replacement fluid 24 can be an inert gas such as helium, nitrogen, argon, or neon. Further, the flow rate and pressure of the replacement fluid 24 can be varied. As provided herein, a flow rate of approximately, one volume change of the optical chamber 16 per minute is believed to be suitable. Further, a pressure of between approximately one and three PSI is believed to be suitable.

Preferably, the optical assembly 10 includes a detector 86 (illustrated in FIG. 1) for detecting when the level of unwanted fluid 27 in the optical section 12 is above acceptable levels. The detector 86 preferably notifies the user when the optical section 12 requires purging with the replacement fluid 24.

Figure 12:
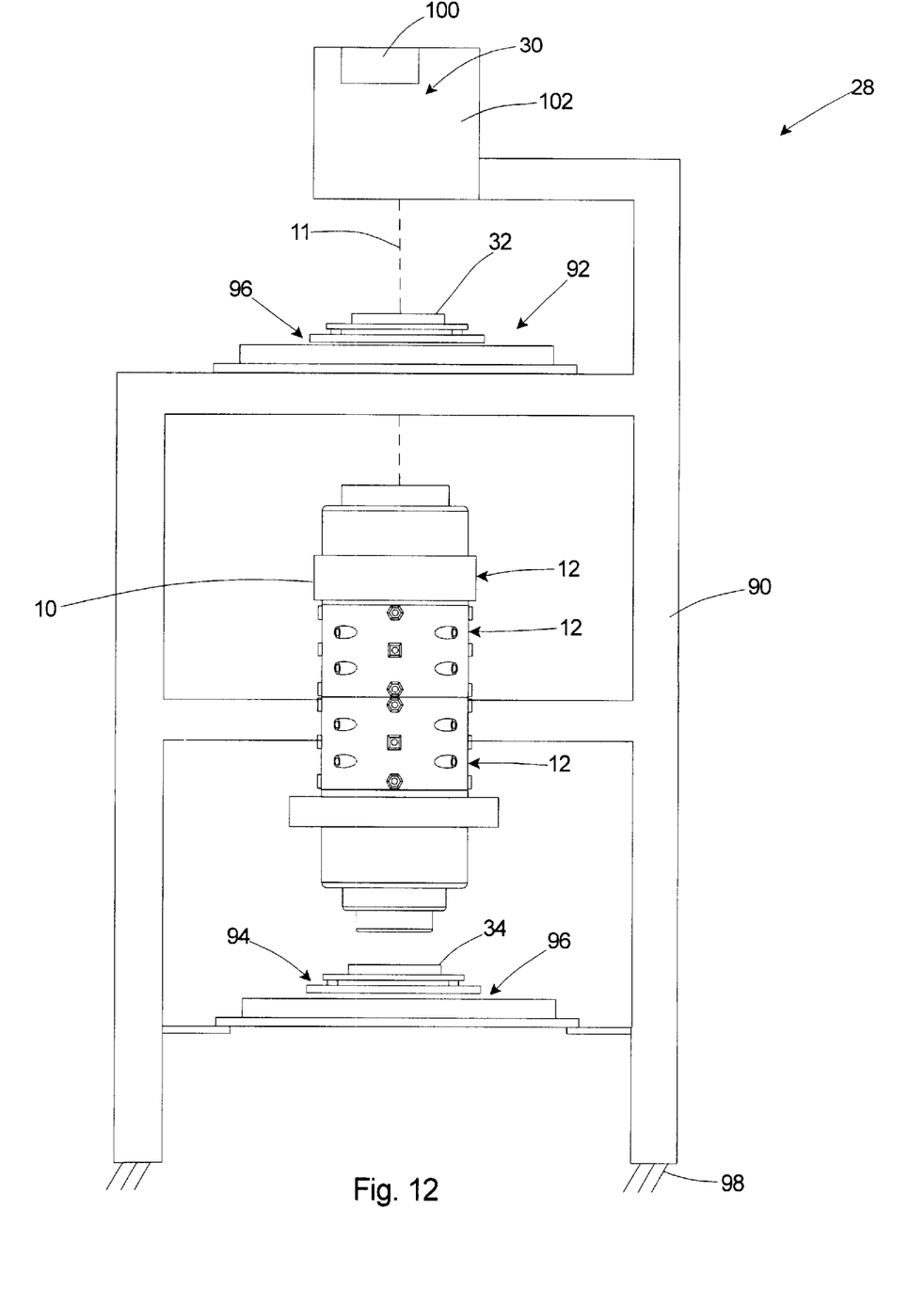
FIG. 12 is a side plan illustration of an exposure apparatus having features of the present invention.

FIG. 12 is a schematic view illustrating the exposure apparatus 28 useful with the present invention. The exposure apparatus 28 includes an apparatus frame 90, the illumination system 30, a reticle stage 92, the optical assembly 10, a wafer stage 94, and one or more of the motors 96 to move and position one or both of the stages 92, 94.

The exposure apparatus 28 is particularly useful as a lithographic device which transfers a pattern (not shown) of an integrated circuit from the reticle 32 onto the semiconductor wafer 34. The exposure apparatus 28 is designed to be mounted to a base 98, i.e., a floor or the ground or some other supporting structure.

The apparatus frame 90 is rigid and supports the components of the exposure apparatus 28. The design of the apparatus frame 90 can be varied to suit the design requirements for the rest of the exposure apparatus 28. The apparatus frame 90 illustrated in FIG. 12, supports the reticle stage 92, the wafer stage 94, the optical assembly 10, and the illumination system 30 above the base 98. Alternately, for example, separate, individual structures (not shown) can be used to support the stages 92, 94, the illumination system 30 and the optical assembly 10 above the base 98.

The illumination system 30 (irradiation apparatus) includes an illumination source 100 and an illumination optical assembly 102. The illumination source 100 emits the beam 11 (irradiation) of light energy that illuminates the reticle 32. The illumination optical assembly 102 guides the beam 11 of light energy from the illumination source 100 to the optical assembly 10. The beam 11 illuminates selectively different portions of the reticle 32 and exposes the wafer 34. In FIG. 12, the illumination system 30 is illustrated as being supported above the reticle stage 92. Typically, however, the illumination source 100 is secured to one of the sides of the apparatus frame 90 and the energy beam from the illumination source 100 is directed to above the reticle stage 92 with the illumination optical assembly 102.

In this embodiment, the optical assembly 10 projects the images of the illuminated portion of the reticle 32 onto the semiconductor wafer 34. Further, the optical assembly 10 is positioned between the reticle stage 92 and the wafer stage 94.

The reticle stage 92 holds and precisely positions the reticle 32 relative to the optical assembly 10 and the semiconductor wafer 34. Somewhat similarly, the wafer stage 94 holds and positions the semiconductor wafer 34 with respect to the projected image of the illuminated portions of the reticle 32. In the embodiment illustrated in FIG. 12, the wafer stage 94 and the reticle stage 92 are positioned by separate planar motors 96. The planar motor drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage. Depending upon the design, the apparatus 28 can also include additional servo drive units and/or linear motors to move the stages 92, 94.

There are a number of different types of exposure apparatus 28. For example, the exposure apparatus 28 can be used a scanning type photolithography system which exposes the pattern from the reticle 32 onto the wafer 34 with the reticle 32 and wafer 34 moving synchronously. In a scanning type lithographic device, the reticle 32 is moved perpendicular to an optical axis of the optical assembly 10 by the reticle stage 94 and the wafer 34 is moved perpendicular to an optical axis of the optical assembly 10 by the wafer stage 94. Scanning of the reticle 32 and the wafer 34 occurs while the reticle 32 and the wafer 34 are moving synchronously.

Alternately, the exposure apparatus 28 can be a step-and-repeat type photolithography system that exposes the reticle 32 while the reticle 32 and the wafer 34 are stationary. In the step and repeat process, the wafer 34 is in a constant position relative to the reticle 32 and the optical assembly 10 during the exposure of an individual field. Subsequently, between consecutive exposure steps, the wafer 34 is consecutively moved by the wafer stage 94 perpendicular to the optical axis of the optical assembly 10 so that the next field of the semiconductor wafer 34 is brought into position relative to the optical assembly 10 and the reticle 32 for exposure. Following this process, the images on the reticle 32 are sequentially exposed onto the fields of the wafer 34 so that the next field of the semi conductive wafer 34 is brought into position relative to the optical assembly 10 and the reticle 32.

However, the use of the exposure apparatus 28 provided herein is not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head.

The illumination source 100 can be g-line (436 nm), i-line (365 nm), KrF excimer laser (248 nm), ArF excimer laser (193 nm) and $F_2$ laser (157 nm). Alternately, the illumination source 100 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 13:
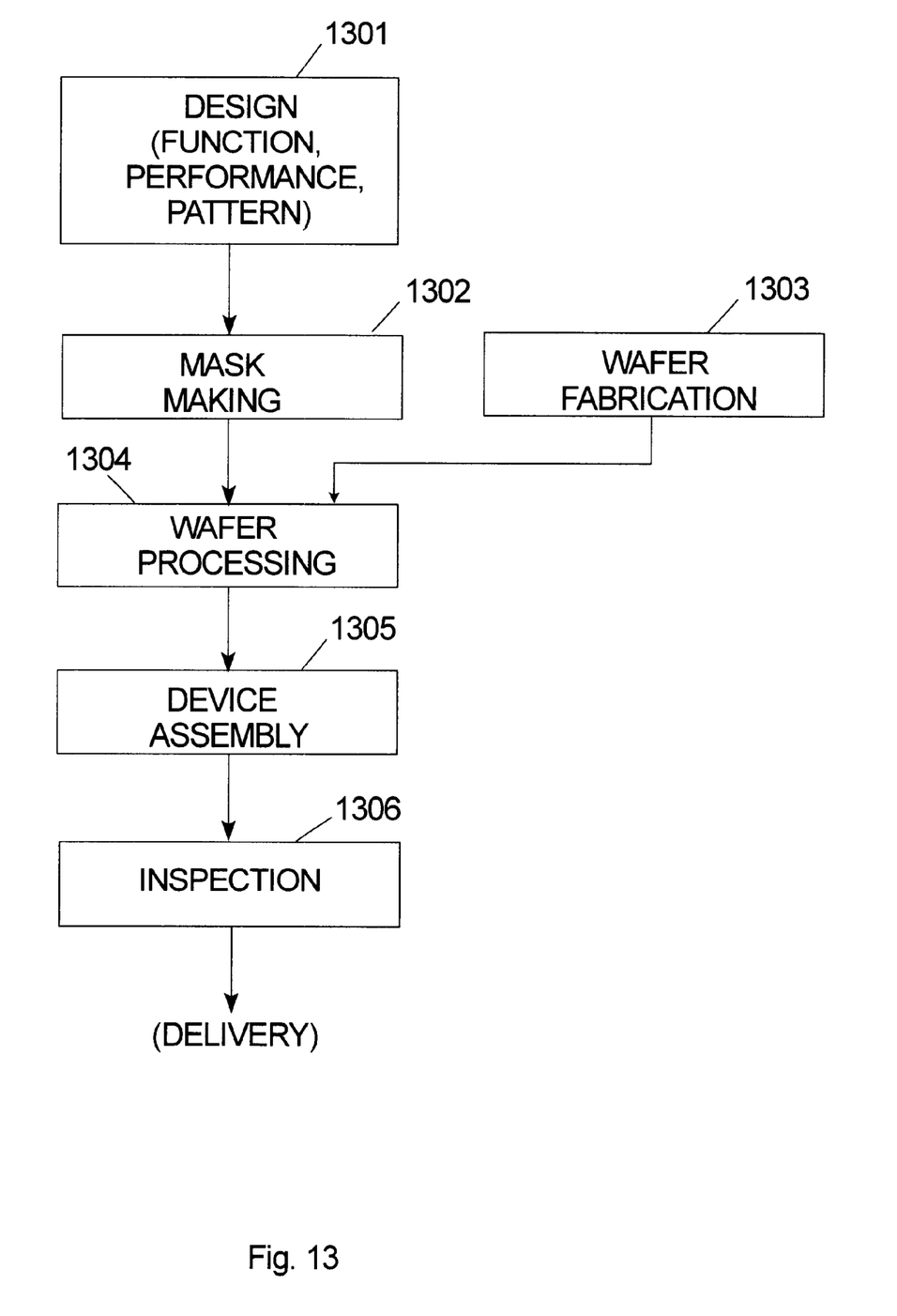
FIG. 13 is a flow chart that outlines a process for manufacturing a device in accordance with the present invention.

Further, semiconductor devices can be fabricated using the above described systems, by the process shown generally in FIG. 13. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 14:
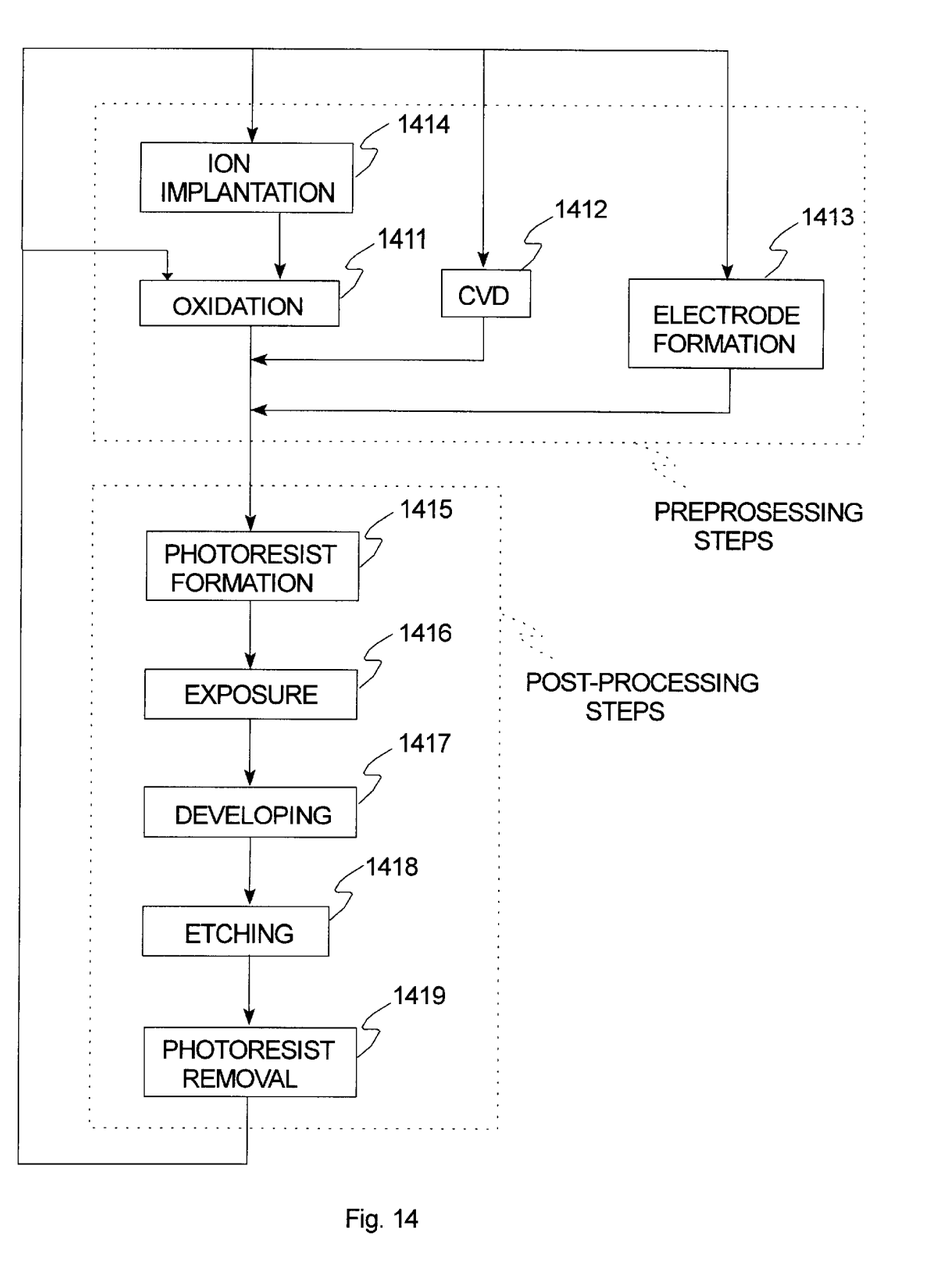
FIG. 14 is a flow chart that outlines device processing in more detail.

FIG. 14 illustrates a detailed flowchart example of the above-mentioned step 304 in the case of fabricating semiconductor devices. In FIG. 14, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular optical assembly 10 and exposure apparatus 28 as illustrated herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An optical assembly for directing a beam of light, the optical assembly being adapted for use with a fluid from a fluid source, the optical assembly comprising:
   an optical housing having an inner wall which defines a optical chamber;
   an optical element; and
   a first inlet port coupled to the fluid source to direct fluid from the fluid source into the optical chamber substantially tangential to the inner wall so that flow of a portion of the fluid from the first inlet port swirls around the optical chamber in a first rotational direction.

2. The optical assembly of claim 1 including an outlet port which extends into the optical chamber, the outlet port allowing for the exhaust of fluid from the optical chamber.

3. The optical assembly of claim 2 wherein the outlet port is positioned near the optical element.

4. The optical assembly of claim 3 wherein the outlet port is positioned substantially radially outward from the optical element.

5. The optical assembly of claim 1 including (i) an optical element supporter disposed between the optical element and the optical housing to support the optical element spaced apart from the optical housing and (ii) an outlet port which extends through the optical element supporter into the optical chamber, the outlet port allowing for the exhaust of fluid from the optical chamber.

6. The optical assembly of claim 1 including a second inlet port which directs fluid from the fluid source into the optical chamber substantially tangential to the inner wall so that flow of the fluid from the second inlet port swirls around the optical chamber in a second rotational direction.

7. The optical assembly of claim 6 wherein when the fluid source alternately directs fluid into the first inlet port and the second inlet port, the direction of the fluid flowing inside the chamber changes temporally between the first rotational direction and the second rotational direction.

8. The optical assembly of claim 1 including a second inlet port which directs fluid from the fluid source into the optical chamber substantially tangential to the inner wall so that the flow of the fluid from the second inlet port swirls around the optical chamber in the first rotational direction.

9. The optical assembly of claim 8 wherein the first inlet port and the second inlet port are spaced apart axially.

10. The optical assembly of claim 7 including an outlet port positioned between the first inlet port and the second inlet port.

11. The optical assembly of claim 10 wherein the outlet port is positioned axially between the first inlet port and the second inlet port.

12. An exposure apparatus including the optical assembly of claim 1 positioned between a first stage and a second stage.

13. The optical assembly of claim 3 further including a second outlet port allowing for the exhaust of fluid from the optical chamber, wherein the second outlet port is spaced apart axially from the outlet port.

14. An optical assembly for directing a beam of light, the optical assembly being adapted for use with a fluid from a fluid source, the optical assembly comprising:
    an optical housing having an inner wall which defines an optical chamber;
    an optical element; and
    a first outlet port which extends into the optical chamber near the optical element.

15. The optical assembly of claim 14 wherein the first outlet port is positioned substantially radially outward from the optical element.

16. The optical assembly of claim 14 including a n optical element supporter dispose d between the optical element and the optical housing to support the optical element spaced apart from the optical housing, wherein the first outlet port extends through the optical element supporter into the optical chamber.

17. The optical assembly of claim 14 including a first inlet port which directs fluid from the fluid source into the optical chamber substantially tangential to the inner wall so that flow of a portion of the fluid from the first inlet port swirls around the optical chamber in a first rotational direction.

18. The optical assembly of claim 17 including a second inlet port which directs fluid from the fluid source into the optical chamber substantially tangential to the inner wall so that flow of the fluid from the second inlet port swirls around the optical chamber in a second rotational direction.

19. The optical assembly of claim 18 wherein when the fluid source alternately directs fluid into the first inlet port and the second inlet port, the direction of the fluid flowing inside the chamber changes temporally between the first rotational direction and the second rotational direction.

20. The optical assembly of claim 17 including a second inlet port which directs fluid from the fluid source into the optical chamber substantially tangential to the inner wall so that the flow of the fluid from the second inlet port swirls around the optical chamber in the first rotational direction.

21. The optical assembly of claim 20 wherein the first inlet port and the second inlet port are spaced apart axially.

22. The optical assembly of claim 20 including an outlet port positioned between the first inlet port and the second inlet port.

23. The optical assembly of claim 22 wherein the outlet port is positioned axially between the first inlet port and the second inlet port.

24. The optical assembly of claim 22 wherein the outlet port is spaced apart axially from the first outlet port.

25. An exposure apparatus including the optical assembly of claim 14 positioned between a first stage a nd a second stage.

26. An optical assembly for an exposure apparatus, the optical assembly being adapted for use with a fluid from a fluid source, the optical assembly comprising:
    a plurality of optical sections, at least one optical section including (i) a substantially tubular shaped optical housing having an inner wall which defines an optical chamber, (ii) an upper optical element, (iii) a lower optical element, (iv) an upper outlet port extending into the optical chamber near the upper optical element, (v) a lower outlet port extending into the optical chamber near the lower optical element, (vi) an intermediate outlet port extending into the optical chamber between the upper outlet port and the lower outlet port, (vii) an upper inlet port which extends into the optical chamber between the upper outlet port and the intermediate outlet port, the upper inlet port directing fluid from the fluid source into the optical chamber substantially tangential to the inner wall so that flow of fluid from the upper inlet port swirls around the optical chamber in a first rotational direction, and (viii) a lower inlet port which extends into the optical chamber between the lower outlet port and the intermediate outlet port, the lower inlet port directing fluid from the fluid source into the optical chamber substantially tangential to the inner wall so that flow of fluid from the lower inlet port swirls around the optical chamber in a first rotational direction.

27. An exposure apparatus including the optical assembly of claim 26.

28. A method for purging an optical section of an optical assembly, the optical section including (i) an optical housing having an inner wall which defines an optical chamber and (ii) an optical element secured to the optical housing, the method comprising the step of:

directing a fluid into the optical chamber substantially tangential to the inner wall so that the fluid swirls in a first rotation direction in the optical chamber.

29. The method of claim 28 including the step of directing the fluid into the optical chamber substantially tangential to the inner wall so that the fluid swirls in a second rotational direction in the optical chamber.

30. The method of claim 29 wherein the steps of directing the fluid into the optical chamber are applied alternately so that the direction of the fluid flowing inside the chamber changes temporally between the first rotation direction and the second rotational direction.

31. The method of claim 28 including the step of exhausting the fluid from the optical chamber with an outlet port which extends into the optical chamber near the optical element.

32. The method of claim 31 including the step of exhausting the fluid from the optical chamber with a second outlet port, wherein the second outlet port is spaced apart axially from the outlet port.

33. The method of claim 28 including the step of directing the fluid from a plurality of spaced apart inlet ports into the optical chamber substantially tangential to the inner wall so that the fluid swirls in a first rotation direction in the optical chamber.

34. The method of claim 33 including the step of exhausting the fluid from the optical chamber with an outlet port which is positioned axially between the plurality of spaced apart inlet ports.

35. An optical assembly for directing a beam of light, the optical assembly adapted for use with a fluid from a fluid source, the optical assembly comprising:

an optical housing having an inner wall which defines an optical chamber;

an optical element; and an inlet port assembly coupled to the fluid source to direct the fluid from the fluid source into the optical chamber so that the direction of the fluid flowing inside the chamber changes temporally between a first direction and a second direction.

36. The optical assembly of claim 35 wherein the inlet port assembly includes a first inlet port and a second inlet port, the first inlet port creates a flow of the fluid in the first direction in the chamber; and the second inlet port creates a flow of the fluid in the second direction in the chamber which is different from the first direction.

37. The optical assembly of claim 35 including a controller that controls the flow of fluid from the fluid source to the inlet port.

38. An exposure apparatus including the optical assembly of claim 35 positioned between an illumination source and a device.

* * * * *

UNITED STATES PATENT AND TRADEMARK OFFICE
CERTIFICATE OF CORRECTION

PATENT NO.    : 6,496,246 B1
DATED         : December 17, 2002
INVENTOR(S)   : Spinali It is certified that error appears in the above-identified patent and that said Letters Patent is hereby corrected as shown below:

Column 12,
Line 1, please replace "claim 7" with -- claim 8 --.
Line 24, please replace "a n" with -- an --.
Line 25, please replace "dispose d" with -- disposed --.
Line 61, please replace "a nd" with -- and --.

Signed and Sealed this

Twenty-seventh Day of May, 2003

JAMES E. ROGAN
*Director of the United States Patent and Trademark Office*